(12) United States Patent
Noelscher et al.

(10) Patent No.: US 7,767,571 B2
(45) Date of Patent: Aug. 3, 2010

(54) METHOD FOR MANUFACTURING A STRUCTURE IN A SEMICONDUCTOR DEVICE AND A STRUCTURE IN A SEMICONDUCTOR DEVICE

(75) Inventors: Christoph Noelscher, Nuremberg (DE); Sebastian Mosler, Dresden (DE)

(73) Assignee: Qimonda AG, Munich (DE)

( * ) Notice: Subject to any disclaimer, the term of this patent is extended or adjusted under 35 U.S.C. 154(b) by 720 days.

(21) Appl. No.: 11/549,487

(22) Filed: Oct. 13, 2006

(65) Prior Publication Data

US 2008/0090398 A1    Apr. 17, 2008

(51) Int. Cl.
*H01L 21/84*    (2006.01)
(52) U.S. Cl. .................. 438/597; 438/149; 438/637
(58) Field of Classification Search .......... None
See application file for complete search history.

(56) References Cited

U.S. PATENT DOCUMENTS

2006/0024621 A1    2/2006   Nölscher et al.

2008/0048327 A1 *  2/2008   Lee .................... 257/758

FOREIGN PATENT DOCUMENTS

| DE | 42 35 702 A1 | 4/1994 |
| DE | 42 36 609 A1 | 5/1994 |
| DE | 10 2004 034 572 A1 | 2/2006 |

OTHER PUBLICATIONS

Noelscher, et al., "Double Line Shrink Lithography at $k_1$= 0.16," Microelectronic Engineering, vol. 83, 2006, pp. 730-733.

* cited by examiner

*Primary Examiner*—Kiesha R Bryant
*Assistant Examiner*—Pamela E Perkins
(74) *Attorney, Agent, or Firm*—Slater & Matsil, L.L.P.

(57) ABSTRACT

The invention is concerned with a method for manufacturing a local wiring in a semiconductor device, comprising the manufacturing of at least two electrically conducting structures essentially in the same horizontal level in a layered stack on a substrate, the at least two electrically conducting structures being separated by a gap filled with at least one dielectric material, the gap being electrically bridged by conductive material, to form at least one contact element electrically connecting the at least two electrically conducting structures, whereby at least one contact element is produced in a single lithographic step.

23 Claims, 5 Drawing Sheets

US 7,767,571 B2

METHOD FOR MANUFACTURING A STRUCTURE IN A SEMICONDUCTOR DEVICE AND A STRUCTURE IN A SEMICONDUCTOR DEVICE

BACKGROUND

The manufacturing of ever smaller structures is a constant challenge in the semiconductor industry which uses lithographic processes extensively. The resolution of the lithographic processes is inherently limited by the wavelengths of the illumination source, the mask and the optics used. Currently wavelengths λ of 248 nm and 193 nm are used. Furthermore, illumination sources using shorter wavelengths, such as 157 nm or extreme ultra violet (EUV) sources with 13 nm are being developed. The theoretical resolution limit can be approached on a substrate by a number of techniques that have been developed.

Using special masks like phase shift masks or binary masks with dipole illumination sources a minimal pitch of line structures of 0.25*lambda/NA can be achieved, with NA=numerical aperture of the imaging system. Generally these structures having a smaller critical dimension than the illumination wavelength are called sub-wavelength structures. Patterns with pitches smaller than 0.25*lambda/NA or smaller than the practical minimum pitch that can be achieved with exposure tools are called sub-lithographic, because they must be produced by help of non-lithographic methods like etching and deposition.

To use the potential of the existing illumination sources (e.g. with wavelengths of 193 nm or 248 nm), the manufacturing of fine sublithographic structures, especially fine regular line structures, using spacer techniques has been described e.g. in the DE 42 35 702 A1 and DE 42 36 609 A1.

In DE 42 36 609 A1 a line-by-spacer method is described to produce sublithographic spacers. In US20060024621A1 and DE102004034572A1 a line-by-spacer-fill and a line-by-liner-fill method are described. Line shrink methods are described in the article in Microelectronic Engineering 83, pages 730 to 733.

SUMMARY OF THE INVENTION

The present invention is concerned with a method for manufacturing a local wiring in a semiconductor device, comprising the manufacturing of at least two electrically conducting structures essentially in the same horizontal level in a layered stack on a substrate, the at least two electrically conducting structures being separated by a gap filled with at least one dielectric material, the gap being electrically bridged by conductive material, to form at least one contact element electrically connecting the at least two electrically conducting structures, whereby at least one contact element is produced in a single lithographic step.

Furthermore, the present invention is concerned with a structure in a local wiring in a semiconductor device, obtained by manufacturing of at least two electrically conducting structures essentially in the same horizontal level in a layered stack on a substrate, the at least two electrically conducting structures being separated by a gap filled with at least one dielectric material, the gap manufactured in one lithography step, the gap electrically bridged with conductive material, to form at least one contact element electrically connecting the at least two electrically conducting structures, whereby at least one contact element is produced in a single lithographic step.

BRIEF DESCRIPTION OF THE DRAWINGS

Other objects and advantages of the invention become apparent upon reading of the detailed description of the invention, and the appended claims provided below, and upon reference to the drawings.

DETAILED DESCRIPTION OF ILLUSTRATIVE EMBODIMENTS

Figure 1:
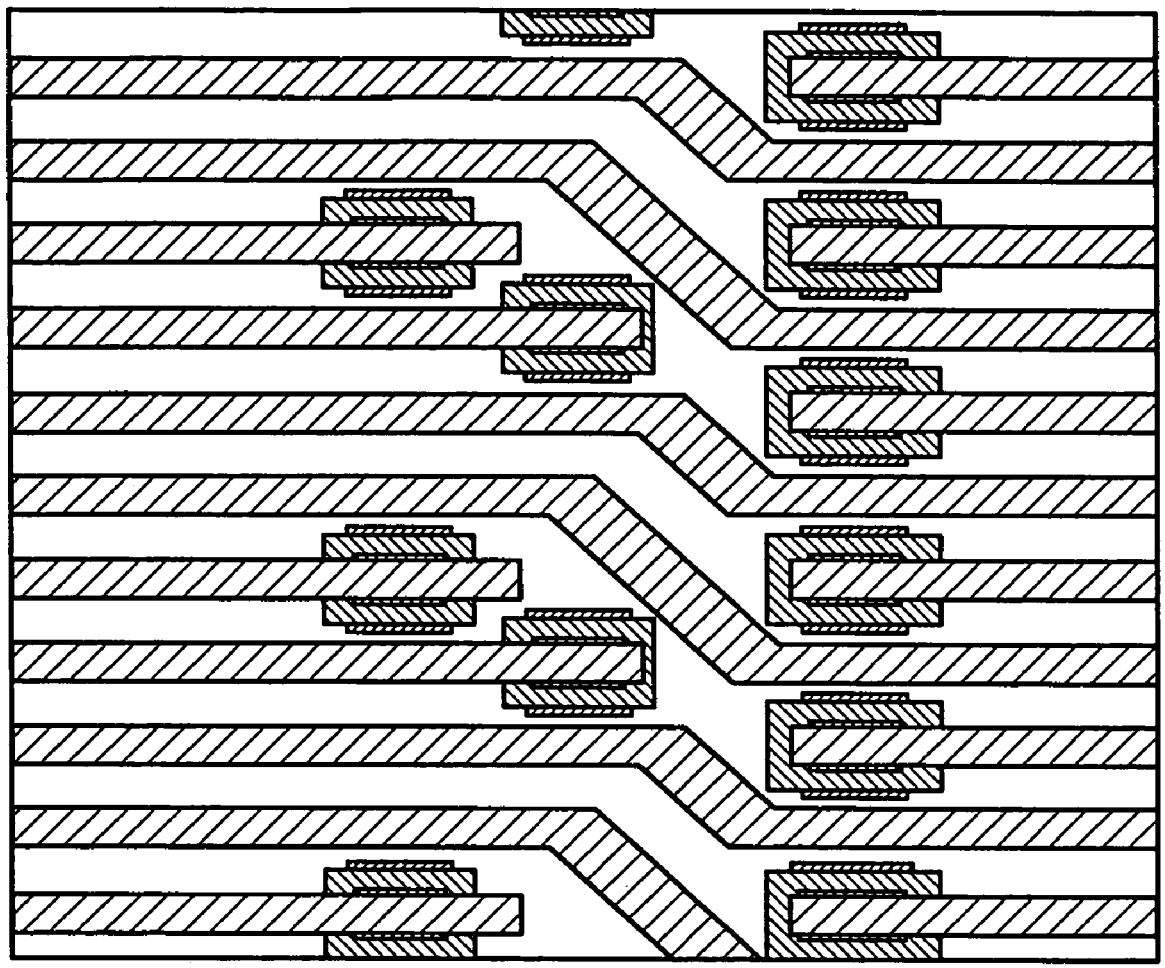
FIG. 1 shows a top view of a line pattern being a part of a DRAM layout showing two separated electrically conducting structures.

FIG. 1 shows a top view of a line pattern being a part of a DRAM layout which is known in the prior art. The different hatching indicates electrically separate conducting structures. The contacts are usually applied through a contact layer and an additional conducting layer, the latter not shown here.

Figure 2:
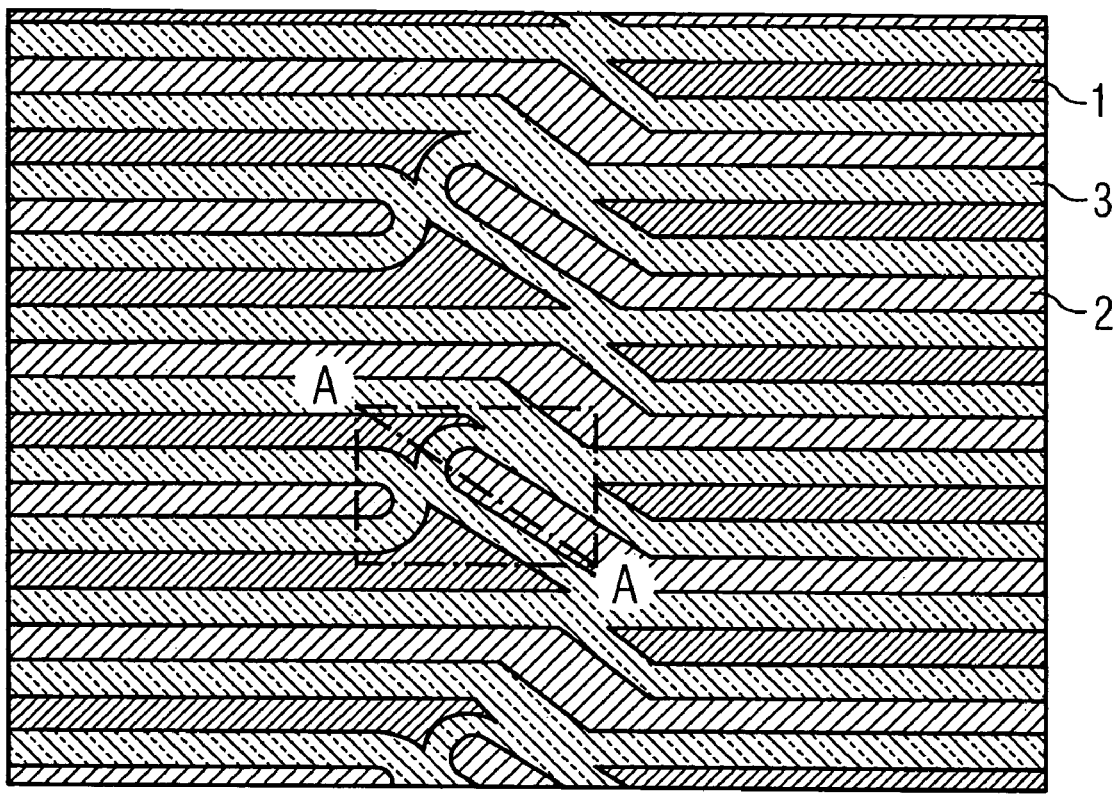
FIG. 2 shows the top-down view of a pattern produced according the invention before the connection is realized.

FIG. 2 schematically shows a top view of a part of a DRAM layout having a pattern of, a first electrically conducting structure 1 and a second electrically conducting structure 2, separated by a structure 3 that comes from a liner deposited conformally around structure 1. The pattern depicted as an non limiting example in FIG. 2 is a regular line pattern. In preferred embodiments the electrical structures 1, 2 can comprise e.g. tungsten, cobalt, copper or aluminum.

The liner may be etched to a spacer or just acts a separator between the first structure and the second structure. The layout of the electrically conducting structures 1, 2 has been manufactured by patterning methods known in the prior art using e.g. patterning of structure 1 by an illumination source with a wavelength of 193 nm, and line-by-spacer-fill process to generate structure 2, remove the spacer and transfer structures 1 and 2 into an underlying conducting layer.

The separator structures 3 are preferably sublithographic structures, i.e. the width of the structures is below the practical resolution limit of the lithographic process. One way to produce sublithographic structures 3 like the dielectric spacers 3 is a line-by-spacer-fill method. In principle other methods, as mentioned above, for the manufacturing of sublithographic structures can be used. The dielectric material can preferably comprise air, silicon oxide, $SiO_xN_y$ or $SiN_x$.

As can be seen, the dielectric sublithographic structure 3 separates the two electrically conducting structures 1, 2 in three locations (indicated by a rectangular with dashed lines) in FIG. 2) so that there is no electrical connection possible in these places. One such place is partially depicted in a cross section view in FIG. 3.

Figure 3:
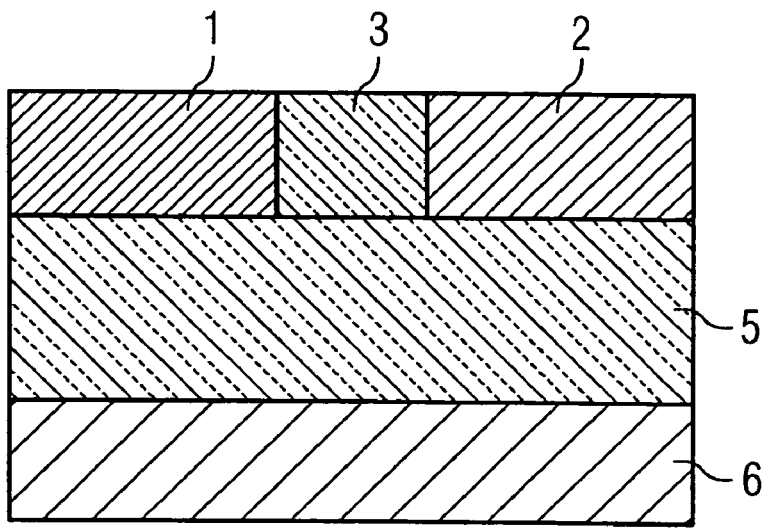
FIG. 3 shows a cross section along line A-A in FIG. 1.

In FIG. 3 the first electrically conducting structure 1 and the second conducting structure 2 are separated by dielectric material in the separator structure 3. The first and second conducting structures 1, 2 are positioned in the layered stack essentially at the same horizontal level, e.g. they are part of the same metallization layer.

Both electrically conducting structures 1, 2 and the spacer structure 3 are here positioned on a dielectric BPSG layer 5 (BPSG: boro-phospho-silicate glass). The BPSG layer 5 is positioned on a silicon substrate 6. A further dielectric layer like SiO2 is positioned on top of and between structures 1 and 2. This material may fill structure 3.

It is understood that the layered stack depicted in FIG. 3 is only meant to illustrate the relative positions of the electrically conducting structures 1, 2 and the gap (i.e. the separator structure 3) filled with dielectric material. The dielectric material could also be an air filled gap. If the gap is manufactured with pitch fragmentation methods as in Microelectronic Engineering 83 (2006) 730-733 or US20060024621A1, the air filled gap could have a sublithographic width.

In a situation shown in FIG. 3, no electric current can flow between the electrical conducting structures 1, 2 due to the insulating effect of the spacer structure 3. It is the aim of the invention to allow for a direct contact between the electrically conducting structures 1, 2, i.e. at A-A of FIG. 2.

A person skilled in the art recognizes that the invention is not limited to the connection of only two electrically conducting structures 1, 2, those structures being linear. The concepts of the invention, to be described in the following can be applied to more general cases of electrically conducting structures 1, 2. There can be more than two electrically conducting structures 1, 2 and the structures do not necessarily have to be essentially linear.

In a first embodiment of the method for manufacturing a structure in a semiconductor device, contact elements 4 are used to bridge the gap (i.e. the dielectric spacer 3) between the first electrical conducting structure 1 and the second electrical conducting structure 2.

Figure 4:
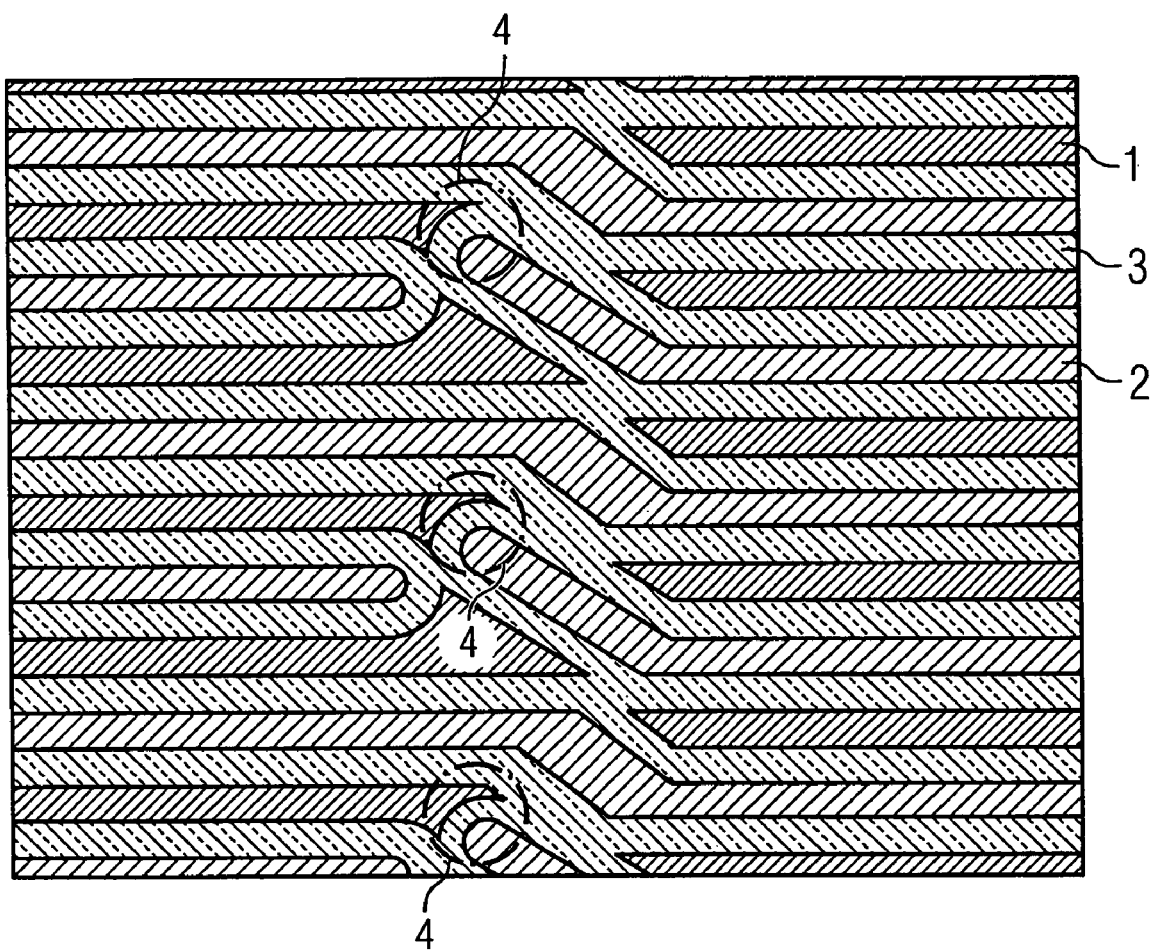
FIG. 4 shows a top view of a line pattern using a first embodiment of the present invention.
Figure 7:
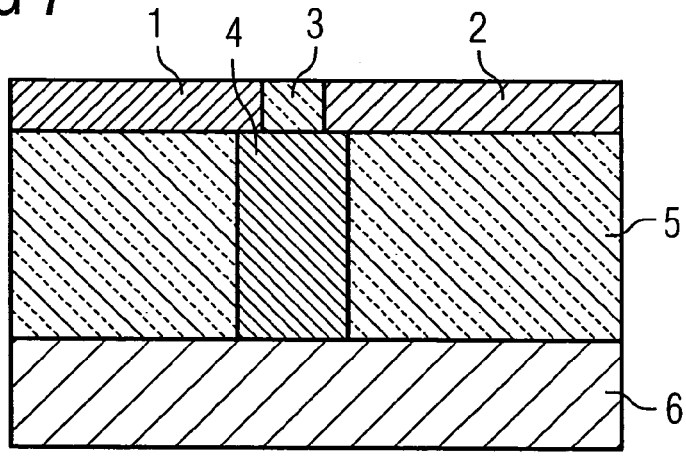
FIG. 7 shows a cross section after a metal layer has been deposited and patterned.

The embodiment of the invention uses contact elements 4 building a bridging contact between the two electrically conducting structures 1, 2. In the top view of FIG. 4 the locations of three contact elements 4 having the shape of round patches are indicated by circles with dashed lines. The contact elements are positioned in the area in which the dielectric spacer 3 is causing the gap. In FIG. 7 a cross section along line A-A is depicted.

In the following FIGS. 5-7 a first embodiment for the method to manufacture contact elements 4 is shown. In the first embodiment the contact element 4 is etched and deposited in a layer below the level of the electrically conducting structures 1, 2.

By the way of example a borophosphosilicate glass (BPSG) layer 5 is deposited on a silicon substrate 6. The silicon substrate 6 is depicted simplified since it might comprise structures from previous process steps.

Figure 5:
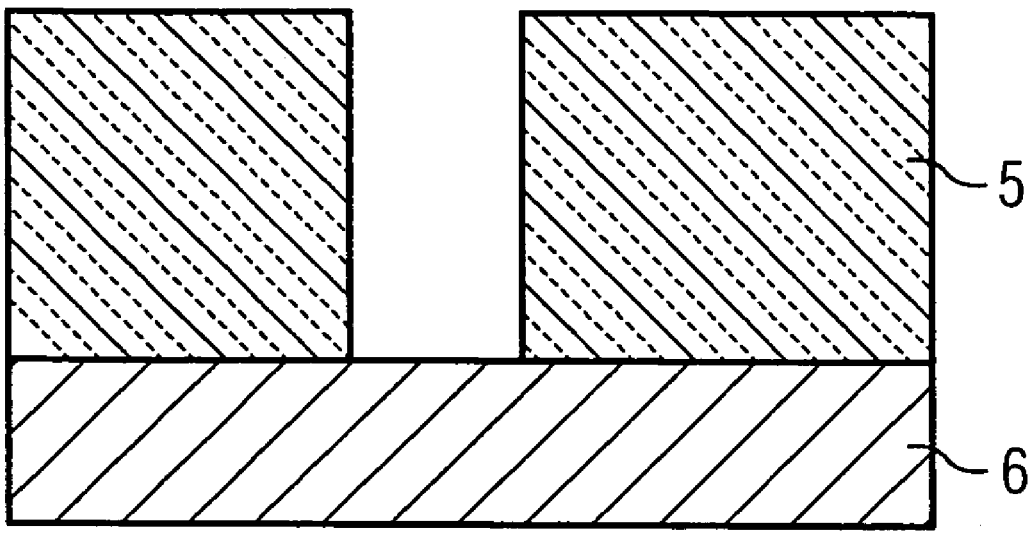
FIG. 5 shows a cross section of the layered stack after a first processing step (etching hole) of the first embodiment of the method.
Figure 6:
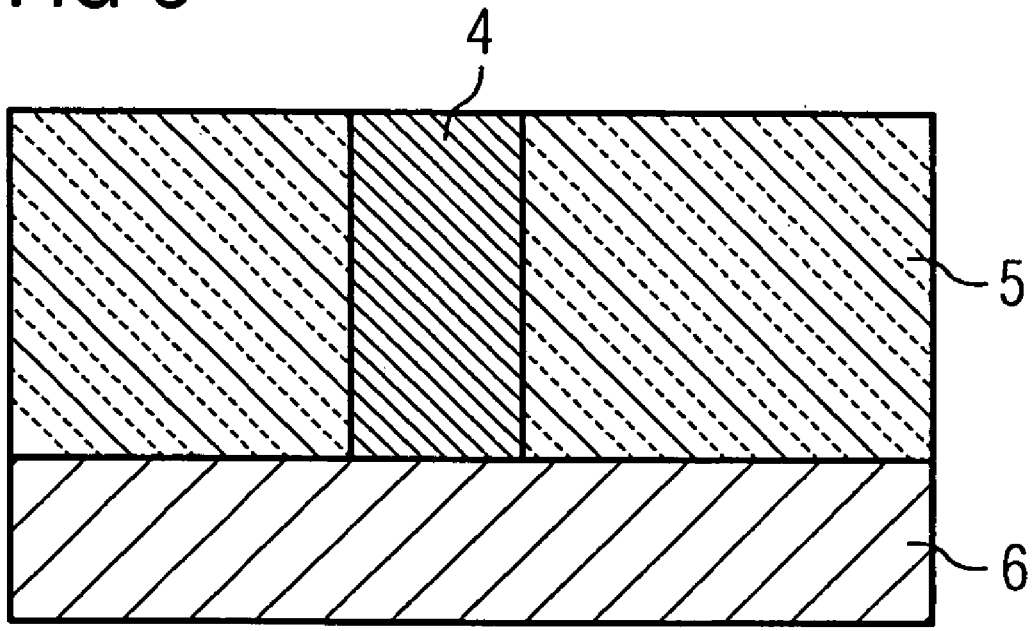
FIG. 6 shows a cross section of the layered stack after second processing step (filling hole) of the first embodiment of the method.

In the BPSG layer 5 a hole is anisotropically etched by e.g. a known dry etch process (FIG. 5). In a next process step the hole in the BPSG layer 5 is filled with an electrically conducting material, e.g. tungsten (FIG. 6).

The surface of the stack is then planarized by e.g. CMP and a further electrically conducting layer is deposited, e.g. Tungsten again. On this layer the sublithographic patterning is applied which generates the dielectric separator structure 3 and the structures 1, 2. These patterns are usually generated on a hardmask that is then transferred to the tungsten layer, which looks after removal of the hardmask as in FIG. 7. The two electrically conducting structures 1, 2 have an overlap with the contact element 4 (see FIG. 7).

The two electrically conducting structures 1, 2 are electrically connected, i.e. bridged, through the contact element 4, even though the dielectric spacer 3 prevents direct contact between the electrically conducting structures 1, 2.

By transferring the structures 1 and 2 (structure 3 is just the space between structures 1 and 2) into the hardmask by etch the contact element 4 might also be etched to some depth because of necessary overetch (not shown). Nevertheless the electrical connection is realized.

It is one advantage of the embodiments shown here that the contact element 4 can be manufactured with one single lithography step, e.g. the hole for the at least one contact element 4 in FIG. 7 is etched after the lithography step and after the etching the hole is filled with conductive material. In principle it is possible to add more contact elements, but the for manufacturing a conductive connection has been established with just one lithography step.

The manufacturing of the contact element 4 in just one lithography step differs from e.g. twisted bitline connections which need more than one lithography step.

Figure 8:
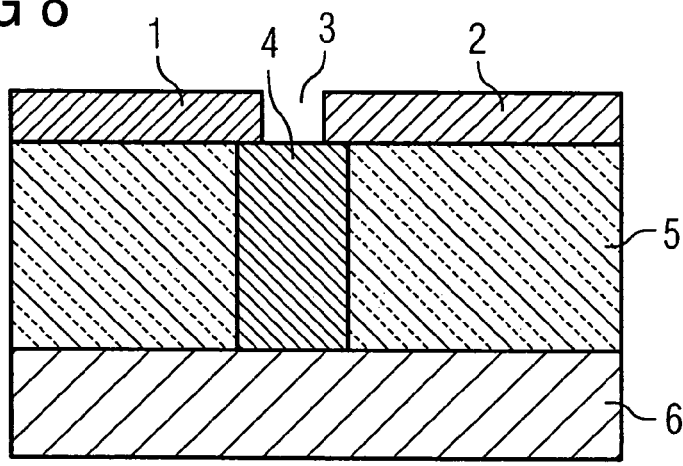
FIG. 8 shows a cross section with a dielectrically filled gap between electrically conducting structures.

In the example depicted in FIGS. 5-7 the dielectric spacer 3 is made of air, later on filled with solid dielectric material SiO$_2$, or the air gap is maintained, as depicted in FIG. 8.

Alternatively the connection is realized not in the underlying dielectric, but in the dielectric layer above the two electrically conducting structures 1, 2. The gap which is air filled after patterning of the layer of structures 1 and 2 is filled with an electrically conducting material, i.e. the gap is bridged, as depicted in FIG. 9, and patterned either directly after deposition of the gap fill, or by deposition of a top dielectric like SiO$_2$, patterning of the gap fill patterns as a hole, etch in the dielectric and fill with conducting material.

Figure 9:
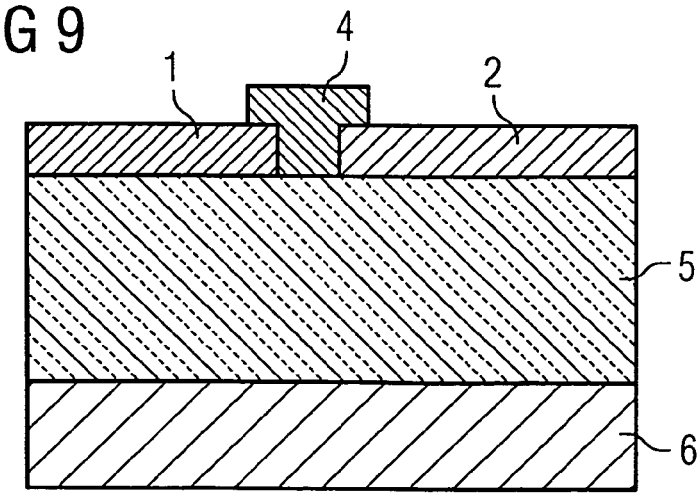
FIG. 9 shows a cross section of a line pattern using a second embodiment of the present invention.

As can be seen from FIGS. 7 and 9 the contact element 4 can be either in a layer deposited before the fabrication of electrically conducting structures 1, 2 or afterwards. In both cases only one lithography step is necessary to produce the contact element 4.

Possible materials for contact elements are tungsten, aluminum, cobalt or copper. Furthermore, polysilicon can be used as filling material. The surface of the polysilicon can be coated with TiSi (if the contact is pointing downwards). In case of a contact pointing upwards a TiN liner is used together with an tungsten fill.

The embodiments of the method and the structures have been described here in connection with a DRAM layout. The present invention is not limited to DRAM layouts but can also be applied in the manufacturing of microprocessors or microelectromechanical devices and of non-volatile memory devices like NOR, NROM or NAND memories.

The invention is concerned with providing a method for structuring a substrate and a structure on a substrate which allows the electrical connection of at least two electrically conducting structures which are separated and have been produced in lithography at a sublithographic distance, such as a spacer width.

An embodiment of the method comprises at least two electrically conducting structures and at least one contact element is deposited to electrically connect the at least two electrically conducting structures. At the connection the two structures are in the same level and the material that realizes the connection had either been deposited and patterned before the material of the two structures has been deposited and looks like a dot (plug) with the two structures at its surface, or it has been deposited afterwards and fills the space between the two structures with electrically conducting material at least at one straight line. The two electrically conducting structures have been made by a sublithographic technique as described in US20060024621A1 either directly or by a consequent hard mask technique.

What is claimed is:

1. Method for manufacturing a local wiring in a semiconductor device, comprising manufacturing at least two electrically conducting structures essentially in the same horizontal level in a layered stack on a substrate, the at least two electrically conducting structures being separated by a gap filled with at least one dielectric material, the gap being electrically bridged by conductive material, to form at least one contact element electrically connecting the at least two electrically conducting structures, whereby the at least one contact element is produced in a single lithographic step, wherein the at least one contact element is positioned by filling a hole with electrically conducting material.

2. Method according to claim 1, wherein the at least one contact element is deposited in a first layer and the at least two electrically conducting structures are deposited in a level above the first layer.

3. Method according to claim 1, wherein at least a first contact element is manufactured in a first layer, the at least two electrically conducting structures are manufactured in a level above the first layer and at least a second contact element is manufactured in a second layer above the at least two electrically conducting structures.

4. Method according to claim 1, wherein the at least one contact element is manufactured in a second layer, the at least two electrically conducting structures are manufactured in a level below the second layer.

5. Method according to claim 1, wherein the at least one dielectric material comprises a line-spacer element, a silicon oxide structure, a $SiO_xN_y$ structure, a $SiN_x$ structure or an airfilled space.

6. Method according to claim 5, wherein the at least one dielectric material is produced by a line-by-spacer method, a line-shrink method, a space-shrink method or an electron beam processing.

7. Method according to claim 1, wherein the at least one contact element comprises a round patch with the at least two electrically conducting structures overlapping the patch.

8. Method according to claim 1, wherein the at least one contact element comprises a polygonal patch with the at least two electrically conducting structures overlapping the patch.

9. Method according to claim 1, wherein the at least two electrically conducting structures are line structures.

10. Method according to claim 1, wherein the at least two electrically conducting structures are part of the same metallization layer.

11. Method according to claim 1, wherein at least one of the electrically conducting structures comprises tungsten, cobalt, aluminum and/or copper.

12. Method according to claim 1, wherein at least one of the electrically conducting structures is manufactured by a pitch fragmentation method.

13. Method according to claim 1, wherein the at least two electrically conducting structures are part of a DRAM layout.

14. Structure in a local wiring in a semiconductor device, obtained by manufacturing of at least two electrically conducting structures essentially in the same horizontal level in a layered stack on a substrate, the at least two electrically conducting structures being separated by a gap filled with at least one dielectric material, the gap manufactured in one lithography step, the gap electrically bridged with conductive material, to form at least one contact element electrically connecting the at least two electrically conducting structures, whereby at least one contact element is produced in a single lithographic step, wherein the at least one contact element comprises a round patch with the at least two electrically conducting structures overlapping the patch.

15. Structure according to claim 14, wherein the at least one contact element lies in a first layer and the at least two electrically conducting structures are lying in a level above the first layer.

16. Structure according to claim 14, wherein the at least one contact element lies in a second layer and the at least two electrically conducting structures are lying in a level under the second layer.

17. Structure according to claim 14, wherein at least a first contact element lies in a first layer, the at least two electrically conducting structures are lying in a level above the first layer and at least a second contact element is lying in a second layer above the at least two electrically conducting structures.

18. Structure according to claim 14, wherein the at least one contact element is fully embedded into dielectric material.

19. Structure according to claim 14, wherein the at least one dielectric material comprises a line-spacer element, sublithographic structure, a silicon oxide structure, a $SiO_xN_y$ structure, a $SiN_x$ structure and/or an airfilled space.

20. Structure according to claim 14, wherein the at least one contact element comprises a polygonal patch with the at least two electrically conducting structures overlapping the patch.

21. Structure according to claim 14, wherein the at least two electrically conducting structures are part of the same metallization layer.

22. Structure according to claim 14, wherein at least one electrically conducting structure comprises tungsten, cobalt or aluminum.

23. Method for manufacturing a local wiring in a semiconductor device, comprising manufacturing at least two electrically conducting structures essentially in the same horizontal level in a layered stack on a substrate, the at least two electrically conducting structures being separated by a gap filled with at least one dielectric material, the gap being electrically bridged by conductive material, to form at least one contact element electrically connecting the at least two electrically conducting structures, whereby at least one contact element is produced in a single lithographic step, wherein the at least one contact element comprises a round patch with the at least two electrically conducting structures overlapping the patch.

* * * * *